(12) United States Patent
Friedman et al.

(10) Patent No.: US 6,366,127 B1
(45) Date of Patent: Apr. 2, 2002

(54) DIGITAL CMOS VOLTAGE INTERFACE CIRCUITS

(75) Inventors: Eby Friedman; Radu M. Secareanu, both of Rochester, NY (US)

(73) Assignee: The University of Rochester, Rochester, NY (US)

(*) Notice: Subject to any disclaimer, the term of this patent is extended or adjusted under 35 U.S.C. 154(b) by 0 days.

(21) Appl. No.: 09/559,937

(22) Filed: Apr. 27, 2000

Related U.S. Application Data

(60) Provisional application No. 60/134,738, filed on May 18, 1999.

(51) Int. Cl.[7] ................... H03K 19/094; H03K 19/0175
(52) U.S. Cl. ............................ 326/83; 326/86; 326/58; 326/62; 326/57; 326/56; 327/333
(58) Field of Search .............................. 326/56–58, 62, 326/63, 68, 80, 81, 86; 327/333

(56) References Cited

U.S. PATENT DOCUMENTS

| | | | | |
|---|---|---|---|---|
| 5,239,211 A | * | 8/1993 | Jinbo | 307/443 |
| 5,278,788 A | * | 1/1994 | Nomura | 365/189.01 |
| 5,414,379 A | * | 5/1995 | Kwon | 327/170 |
| 5,889,707 A | * | 3/1999 | Yang | 365/189.05 |
| 6,043,698 A | * | 3/2000 | Hill | 327/333 |
| 6,166,561 A | * | 12/2000 | Fifield et al. | 326/57 |

OTHER PUBLICATIONS

Secareanu, R.M. et al., A High Speed CMOS Buffer for Driving Large Capacitive Loads in Digital ASICs, Proceedings of the IEEE ASIC Conference, pp. 365–368, Sep., 1998.
Caravella, J.S. et al., Three Volt to Five Volt CMOS Interface Circuit with Device Leakage Limited DC Power Dissipation, Proceedings of the IEEE ASIC Conference, pp. 448–451, Sep., 1993.
Wada, Y. et al., Highly Reliable Process Insensitve 3.3V–5V Interface Circuit, Proceedings of the Symposium on VLSI Circuits, pp. 90–91, Jun., 1992.
Ohkawa, M. et al., A 0.6 um CMOS SOG with 5v/3.3V Interfaces, Proceedings of the Symposium on VLSI Circuits, pp. 88–89, Jun., 1992.
Golshan, R. et al., A Novel Reduced Swing CMOS BUS Interface Circuit for High Speed Low Power VLSI Systems, Proceedings of the IEEE International Symposium on Circuits and Systems, vol. 4, pp. 351–354, Jun., 1994.
Tomita, T. et al., 622 Mbps 8 mW CMOS Low–Voltage Interface Circuit, IEICE Transactions on Electronics, vol. E78–C, No. 12, pp. 1726–1732, Dec., 1995.
Veendrick, H.J.M., Short–Circuit Dissipation of Static CMOS Circuitry and its Impact on the Design of Buffer Circuits, IEEE Journal of Solid–State Circuits, vol. SC–19, No. 4, pp. 468–473, Aug., 1984.
Vemuru, S.R. et al., Short–Circuit Power Dissipation Estimation for CMOS Logic Gates, IEEE Transactions on Circuits and System—I: Fundamental Theory and Applications, vol. 41, No. 11, pp. 762–765, Nov., 1994.
Lin, H.C. et al., An Optimized Output Stage for MOS Integrated Circuits, IEEE Journal of Solid–State Circuits, vol. SC–10, No. 2, pp. 106–109, Apr., 1975.
Hedenstierna N. et al., CMOS Circuit Speed and Buffer Optimization, IEEE Transactions on Computer–Aided Design, vol. CAD–6, No. 2, pp. 270–281, Mar., 1987.

\* cited by examiner

*Primary Examiner*—Michael Tokar
*Assistant Examiner*—Vibol Tan
(74) *Attorney, Agent, or Firm*—Kenneth J. LuKacher; Martin LuKacher

(57) ABSTRACT

CMOS voltage interface circuits have low power consumption, and minimal delays and power dissipation for the driving strength of the output. The circuits use a interface block which is operative upon the applied input signal, depending upon its state and timing, to generate the output at a specified voltage level which may be different from the level of the applied input.

30 Claims, 9 Drawing Sheets

DIGITAL CMOS VOLTAGE INTERFACE CIRCUITS

This Appln claims benefit of Prov. No. 60/134,738 filed May 18, 1999.

The United States Government may have rights in this invention under NSF Grant MIP-9610108.

DESCRIPTION

This present invention relates to digital CMOS voltage interface circuits, particularly, voltage interfaces which transfer the digital signal between any two voltages, with minimal power dissipation. The interfaces may contain circuitry operating at both involved voltages (power supplies), or they may contain circuitry operating to only one power supply.

CMOS is the principal technology used today to implement digital as well as analog applications. Today, practically all high performance digital circuits are based on CMOS. When scaling a CMOS technology, the supply voltages are decreased to control the magnitude of the electric fields inside the transistors. In addition to controlling the velocity of the electron flow, another beneficial aspect of voltage scaling is a quadratic decrease in dynamic power dissipation with supply voltage as expressed by $P_D = C_L V^2_{DD} f$. However, a tradeoff occurs, since decreasing the power supply also decreases the circuit speed. As a consequence, different circuit blocks operating at different power supplies are often found in modern processors, such as high speed blocks operating at 5 volts for the critical paths, while the rest of the processor operates at 3.3 volts. Multiple on-chip power supplies are also found in other circuit families such as in mixed signal circuits. Therefore, high performance interfaces are frequently necessary. The signal transfer between low-to-high voltage levels and high-to-low voltage levels has to be performed with minimum delay and power in order to maintain any advantages obtained from using multiple power supplies.

A prior art CMOS interface circuit for converting a low voltage (e.g., 3 V) signal into a high voltage (e.g., 5 V) signal is shown in FIG. 1. If Out1 is low, P5 is on, N5 is off, and Out2 is high. If Out1 is high, both P5 and N5 are on. To make Out2 go low, N5 must have a higher transconductance than P5. Significant static power dissipation is therefore generated during the time Out1 is high. A small P5, however, affects the low-to-high transition of Out2, increasing this transition time. Different interface circuits have been developed to solve those problems and provide an efficient interface, but have not been completely satisfactory.

It is therefore an object of this invention to provide improved interface circuits that are characterized by low power dissipation and minimal delay from input to output.

Another object of this invention is to provide an improved interface circuit that provides at the output, a high driving strength capability with minimal delay and power dissipation.

Another object of this invention is to provide an improved interface circuit that provides the signal voltage exchange while being equivalent in logic function to an inverter, providing a delay equivalent to the delay of an inverter.

Yet another object of this invention is to provide an improved voltage interface circuit with no practical limitations on the magnitude of the voltage levels of the two CMOS families being interfaced, as well as to maintain the same circuit configuration and transistor sizes for both the low-to-high and high-to-low voltage interfaces.

Another object of this invention is to provide an improved interface circuit that operates at one voltage (power supply) with minimal power dissipation.

Briefly described, an interface circuit embodying the invention has an interface block which has two branches which, respectively, receive from an in input block two signals corresponding to an input, which change in polarity in opposite senses, and pass them to an output via a buffer block in which the signals are combined.

The foregoing and other objects, features and advantages of the invention will become more apparent from a reading of the following description, in connection with the accompanying drawings.

FIGS. 7A–D are waveforms diagrams for the typical operation of a 3 V to 5 V interface circuit according to the present invention.

Figure 8:
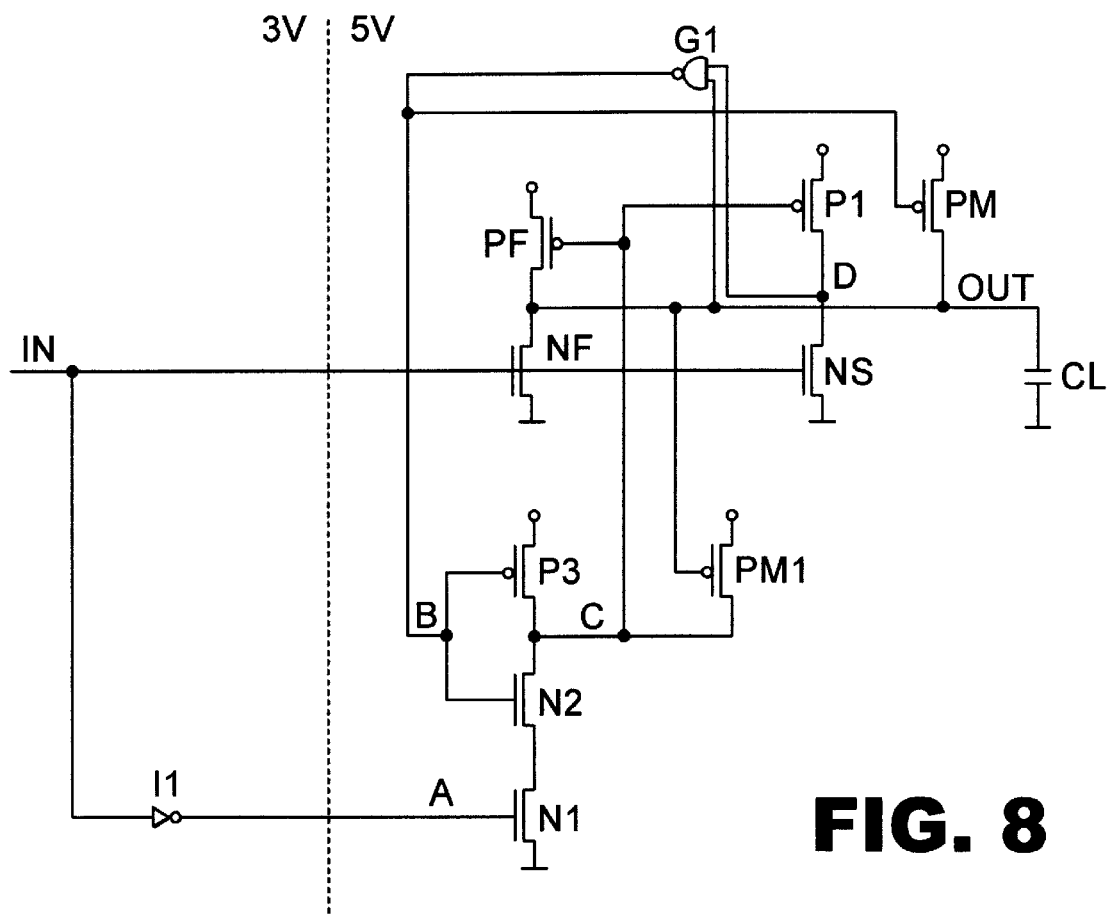

FIG. 8 is a transistor level schematic diagram of another interface circuit according to the invention.

Figure 9:
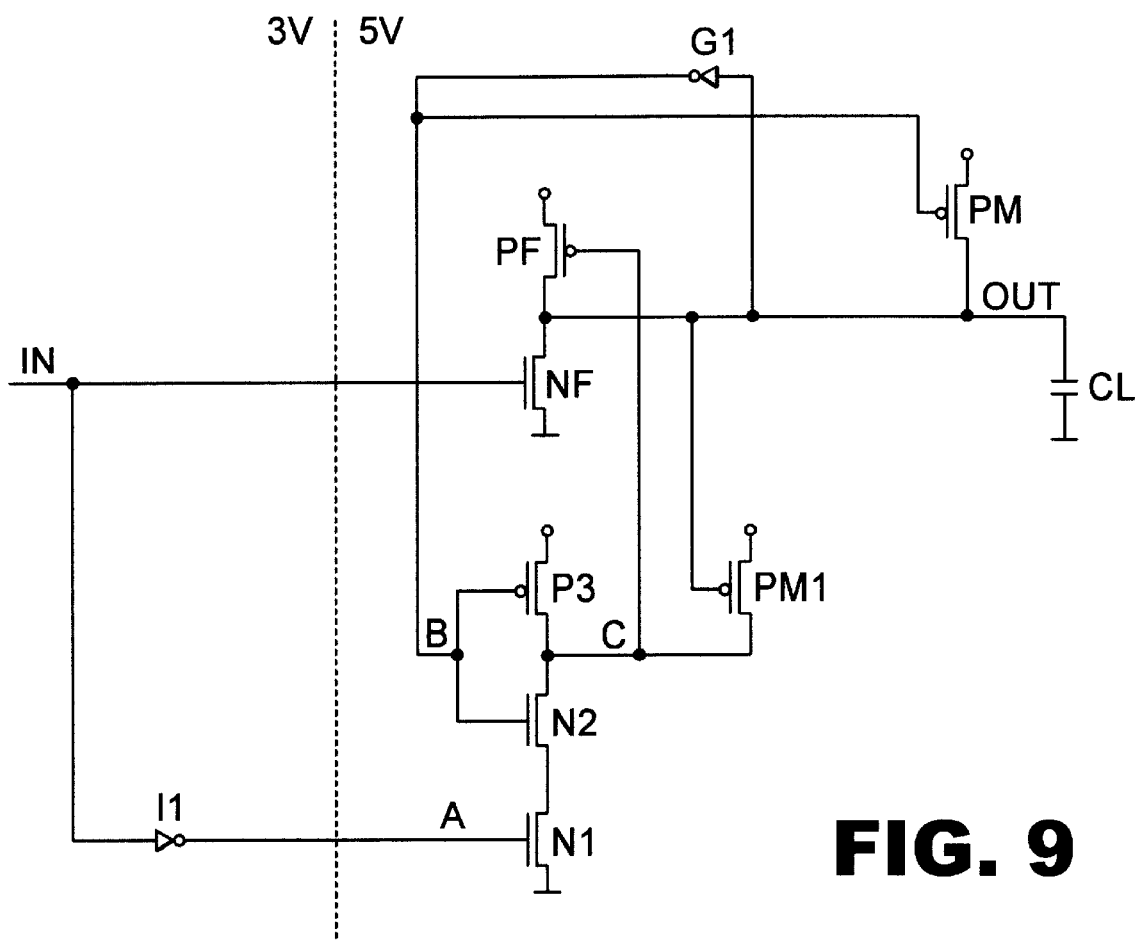

FIG. 9 is a simplified transistor level schematic diagram of the circuit shown in FIG. 8.

Figure 10:
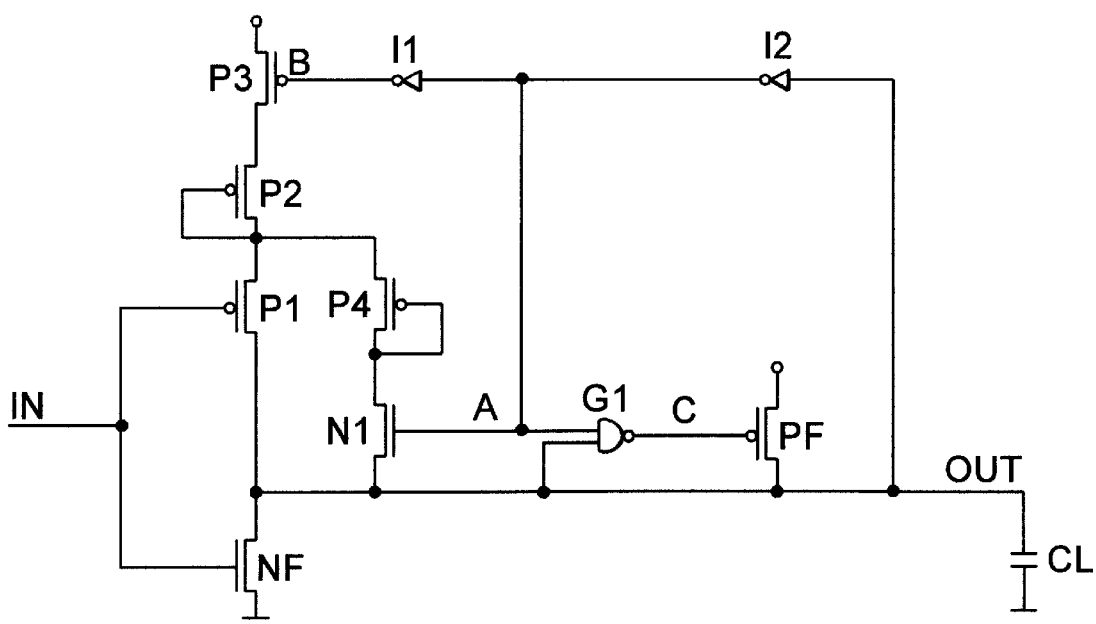

FIG. 10 is a transistor level schematic diagram of still another interface circuit according to the invention.

Figure 11:
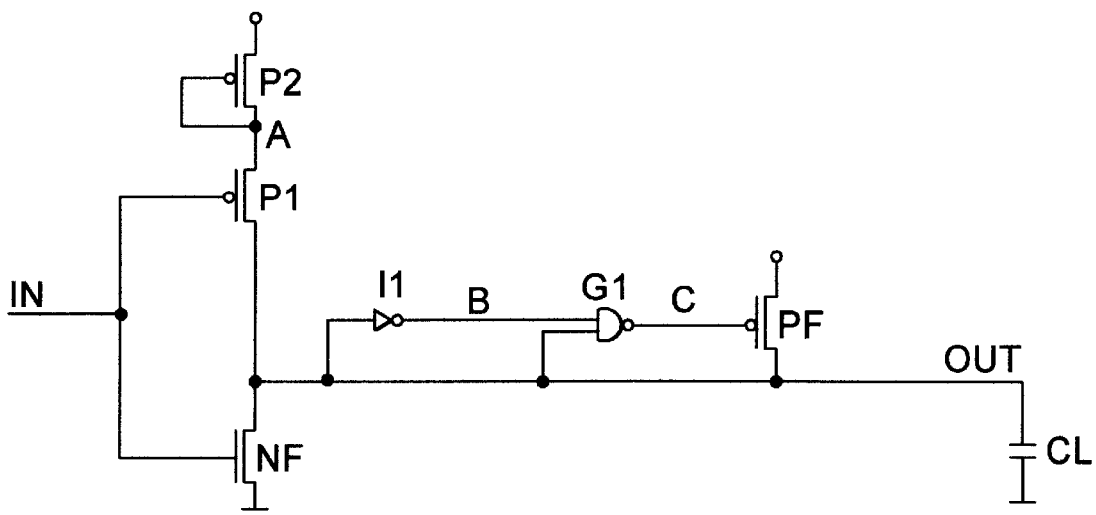

FIG. 11 is a transistor level schematic diagram of an interface circuit related to the circuit shown in FIG. 10.

Figure 12:
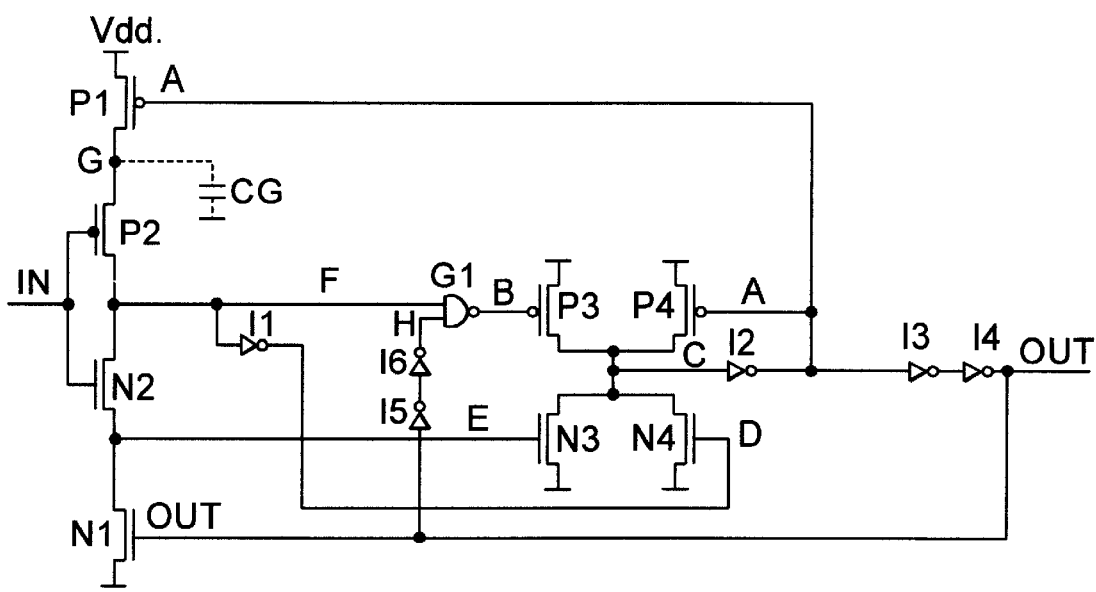

FIG. 12 is a transistor level schematic diagram of still another interface circuit according to the present invention.

Figure 13:
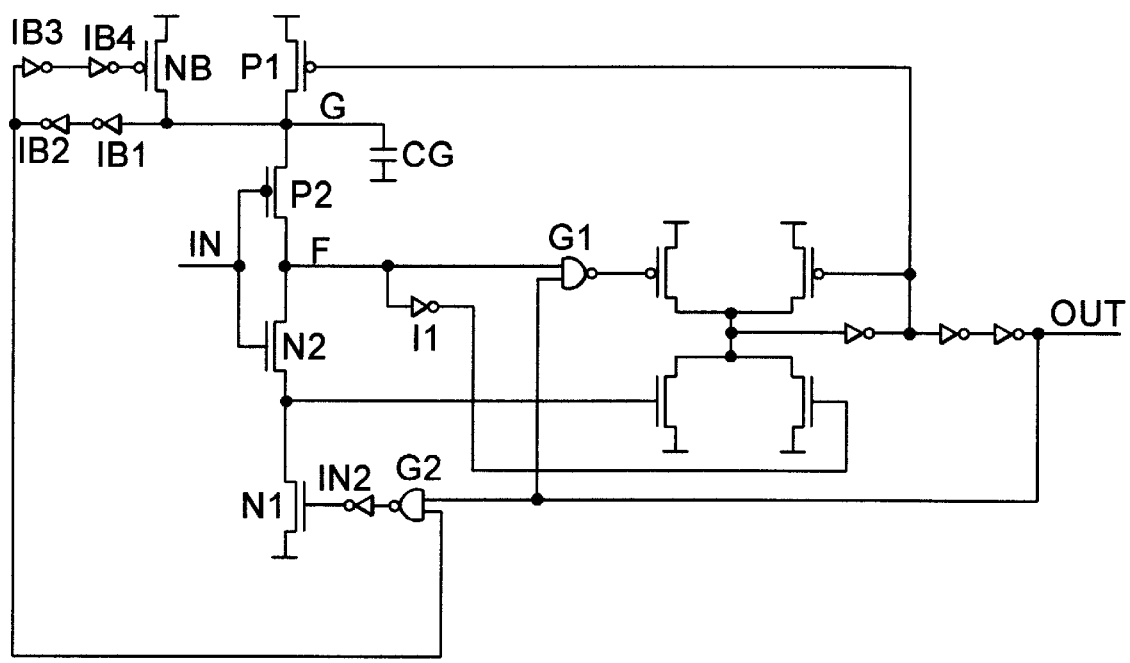

FIG. 13 is a transistor level schematic diagram version of still another voltage interface circuit according to the present invention.

Figure 2:
FIG. 2 is a block schematic of an interface circuit according to the present invention.

Referring to FIG. 2 there is shown an interface circuit with an input signal conditioning block, the interface block, and the buffer block.

In many applications, signals that require to be interfaced also require buffering. For example, in a processor operating at 3 volts, highly combinatorial circuits such as an adder, operate at 5 volts, to gain speed. The signal inputs to such highly combinatorial circuits are interfaced from 3 volts to 5 volts, becoming 5 volt signals. The 5 volt signals must propagate quickly through the entire combinatorial circuit. Therefore, typically, the interface output may be required to drive RC interconnect with high fan-in from the gates of the combinatorial circuit. Accordingly, the interface output requires buffering in such applications. Another example is the interface between two chips, one operating at 3 volts, the other operating at 5 volts. The signals coming from the 3 volts chip have to be interfaced at 5 volts becoming 5 volt signals in the second chip. If the interfaced 5 volt signals represent a data bus for example, they face a large interconnect RC load and a large fan-in, and accordingly, buffering is required. The interface circuit shown in FIG. 2 provides a high-driving strength at the output, being suitable for such applications as require buffering.

It will become apparent, as the description proceeds, that the interface provided by the invention circuits reduce static power dissipation while accomplishing its specific tasks.

The interface circuit of FIG. 2 has an input signal conditioning block, an interface block and a buffer block.

Figure 3:
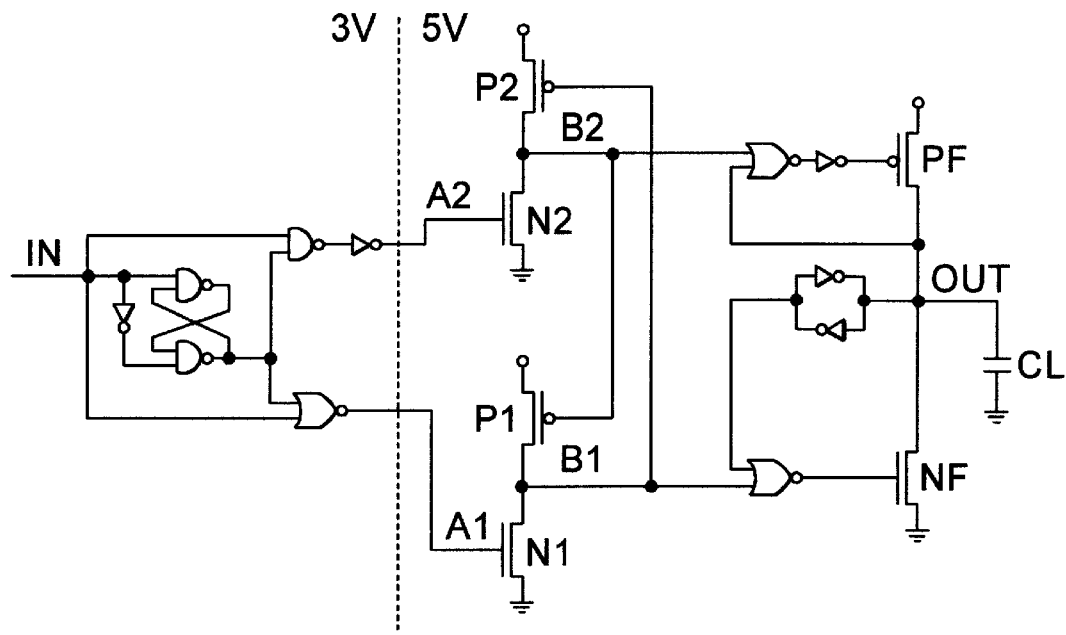
FIG. 3 is a transistor level schematic diagram of a CMOS voltage interface circuit according to the present invention.

A transistor level schematic of the interface circuit of FIG. 2 for a 3 V to 5 V interface is shown in FIG. 3. Note the 3 V–5 V demarcation line. At the left of the demarcation line is the input signal conditioning block, which here is a block operating at 3 volts. Note that A1 is high when In is low and A2 is high when In is high. A1 and A2 are latched and in an alternate state for each input transition. Accordingly, the 3 volt input signal conditioning block acts as a single input—two output converter.

Note that A1 and A2, the outputs of the signal conditional block, drive the interface block, namely two NMOS transistors, N1 and N2. The outputs of the interface block are the B1 and B2 signals. B1 is low when In is low and B2 is low when In is high. Note the feedback paths from B1 to P2 and from B2 to P1. If In is low, A1 is high, N1 is on, N2 is off, B1 is low, P1 is off, P2 is on, and B2 is slowly pulled high by P2. P1 and P2 are sized smaller than N1 and N2, so that N1 and N2 always wins when fighting with P1 respectively P2. When N1 and N2 are driven by the low voltage signal, N1 and N2 should be larger in size due to the small voltage swing on their gates.

Figure 4:
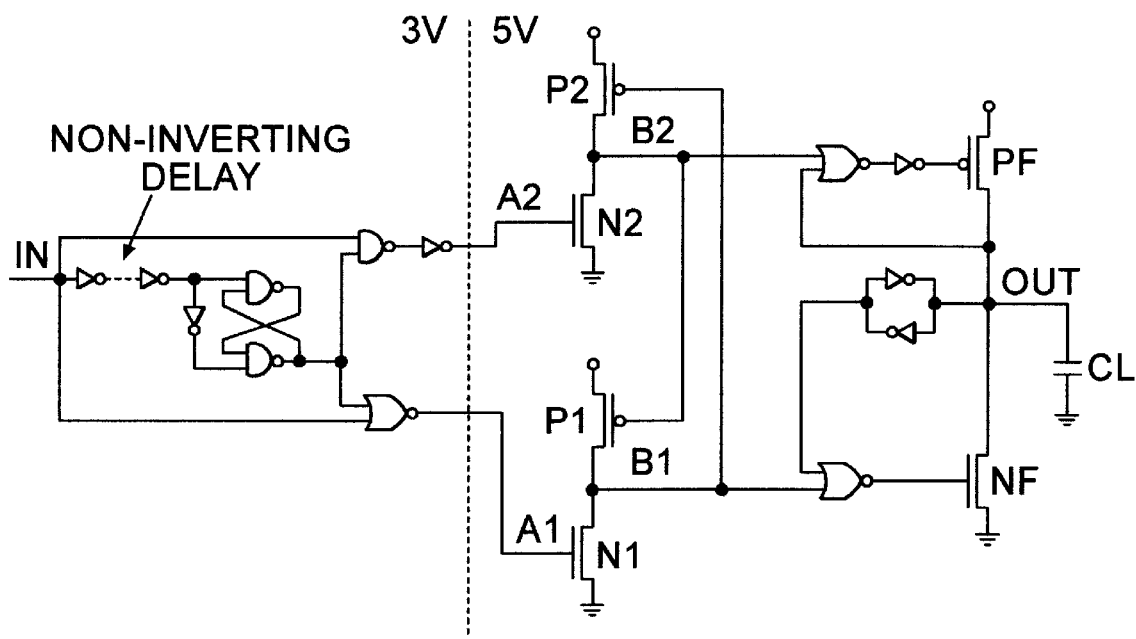
FIG. 4 is a transistor level schematic diagram of a CMOS voltage interface circuit with its input signal conditioning block providing increased non-overlapping time for A1 and A2 signals also according to the present invention.

Note that at this point, the 3 V to 5 V interface has been completed. The 3 volt input signal conditioning block provides non-overlapping A1 and A2 outputs to eliminate any static power dissipation and to provide glitch-free operation. If A1 is high, B2 shifts high and B1 shifts low. A1 and A2 are non-overlapping, so A1 and A2 are both low before A2 becomes high. To increase the time during which both A1 and A2 are low, a supplemental non-inverting delay, as shown in FIG. 4, is inserted between In and the latch input.

Figure 5:
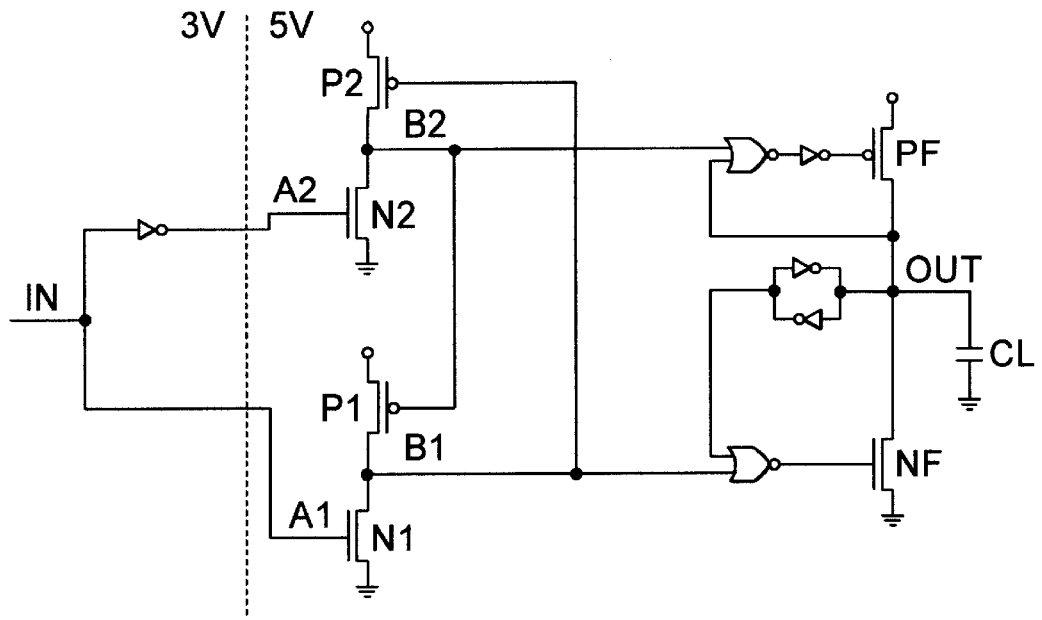
FIG. 5 is a transistor level schematic diagram a CMOS voltage interface circuit with its input signal conditioning block providing overlapping A1 and A2 signals, also according to the present invention.

If A1 and A2 are overlapping, such as for the circuit shown in FIG. 5, when In is high, DC paths are created from VDD to ground through both N1 and P1 and N2 and P2, since all N1, P1, N2 and P2 are on. This situation creates a high power dissipation, and also may produce glitches at the output of the buffer block together with extra power dissipation in the buffer block.

Returning to FIG. 3, when A2 is high, B2 becomes low, and since N1 is off, B1 is slowly pulled high by P1. At this point, B1 is low, B2 is low, N1 is off, P1 is on, N2 is on, and P2 is on. Note that until B1 is pulled high, the P2–N2 path dissipates a power similar to a short-circuit power (which becomes zero when the transition is completed). A similar action occurs for the P1–N1 path during the high-to-low input transition. Versions of this circuit can eliminate this small short-circuit current, but the additional hardware dissipates more power than is saved.

The high-to-low transition of B1 and B2 is fast, while the low-to-high transition of both the B1 and B2 outputs is slow, the current being sourced by the small P1 and P2 transistors, respectively. The interface block through the B1 and B2 outputs drives the buffer block, which is an HD buffer-like circuit as described in our patent application, "Digital Buffer Circuits", Ser. No. 60/086711, filed May 26, 1998 and converted into application Ser. No. 09/318421, filed on or about May 25, 1999, now U.S. Pat. No. 6,163,174, and also described in an article by R. M. Secareanu and Eby Friedman, "A High Speed CMOS Buffer For Driving Large Capacitive Loads, Proc. of IEEE ASIC Conf. pp. 365–368, September 1998 (incorporated by this reference herein), that has B1 and B2 as inputs. A one-stage buffer is shown in FIG. 3, while in FIG. 6, a three-stage buffer is shown. The high-speed buffering capability is provided due to the use of the HD buffer-like circuit as described in that patent application. A supplemental gain in speed is noted as compared to a typical HD buffer circuit as described in our said patent application, since two differential signals B1 and B2 to drive the two signal paths of the HD buffer are already available for this interface circuit.

Figure 6:
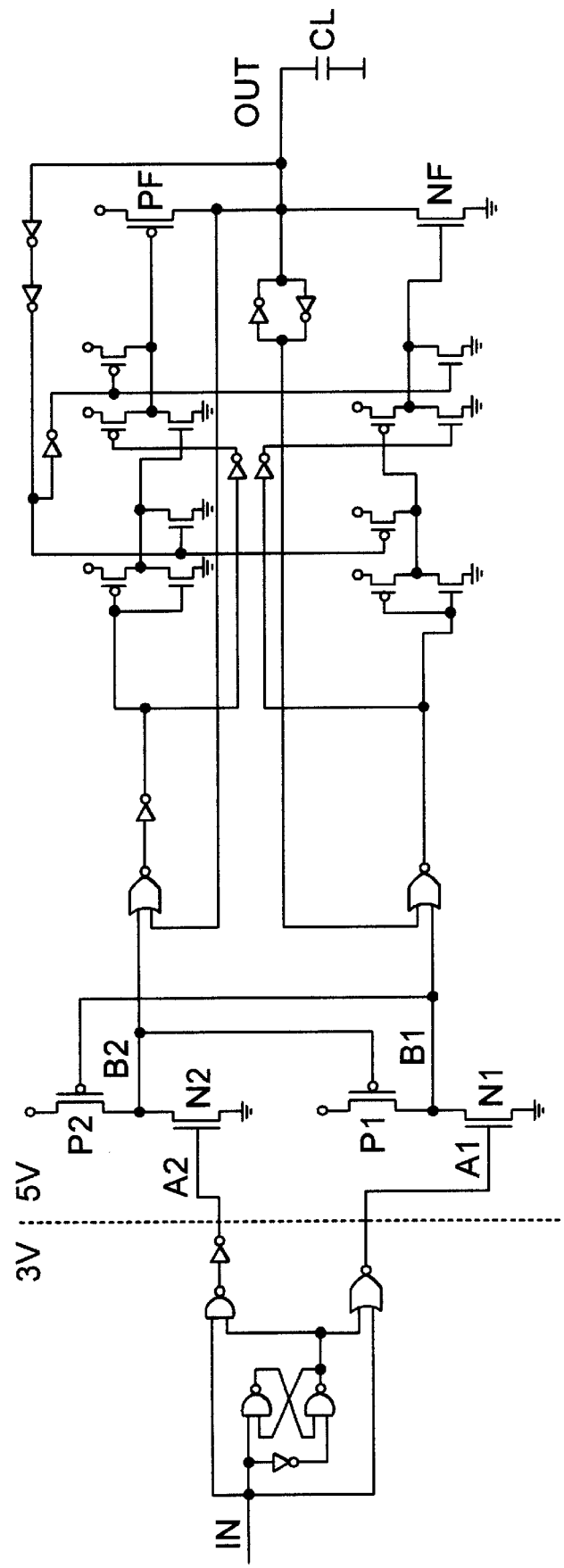
FIG. 6 is a transistor level schematic diagram a CMOS voltage interface circuit with a three stage output HD buffer block, also according to the present invention.
Figure 7A:
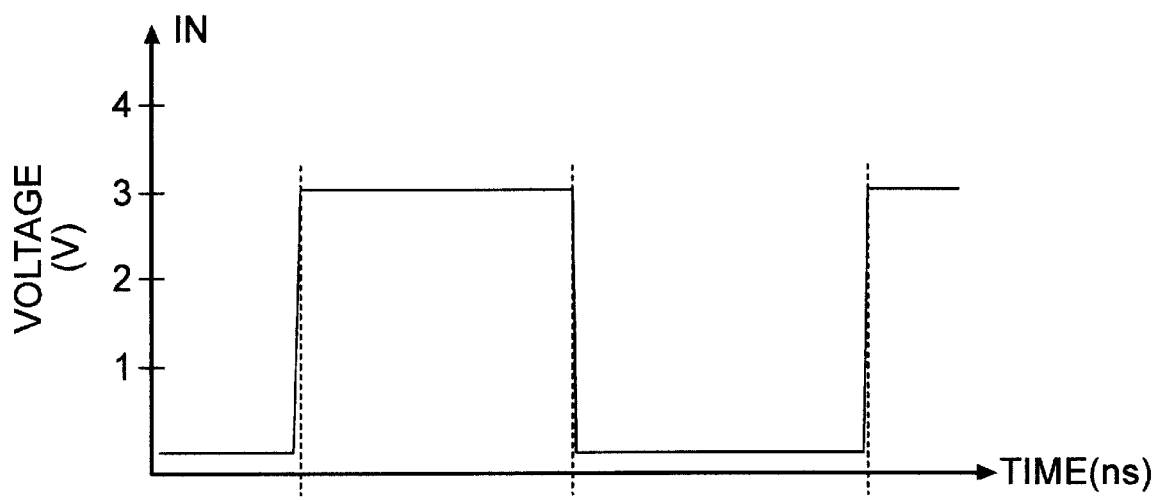
Figure 7B:
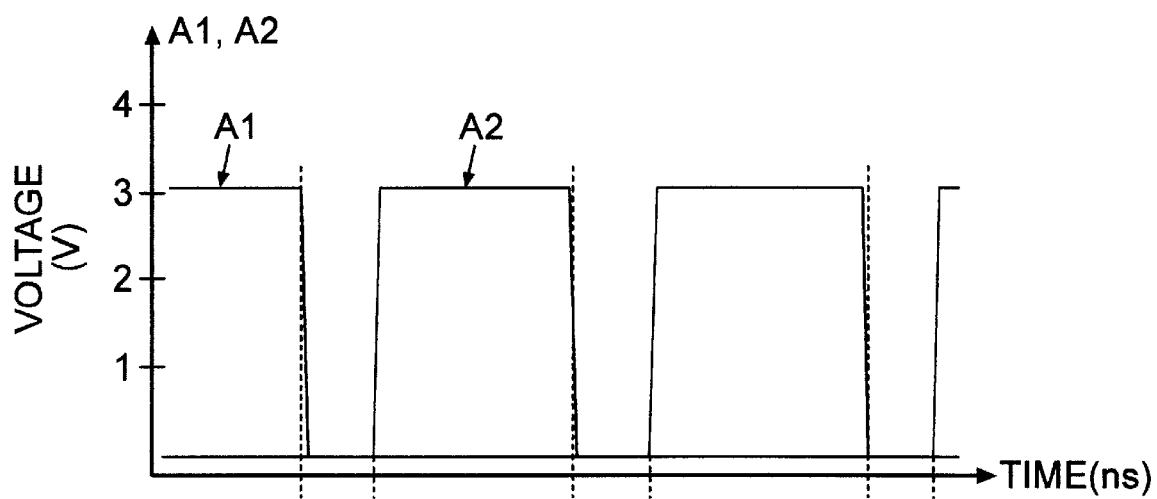
Figure 7C:
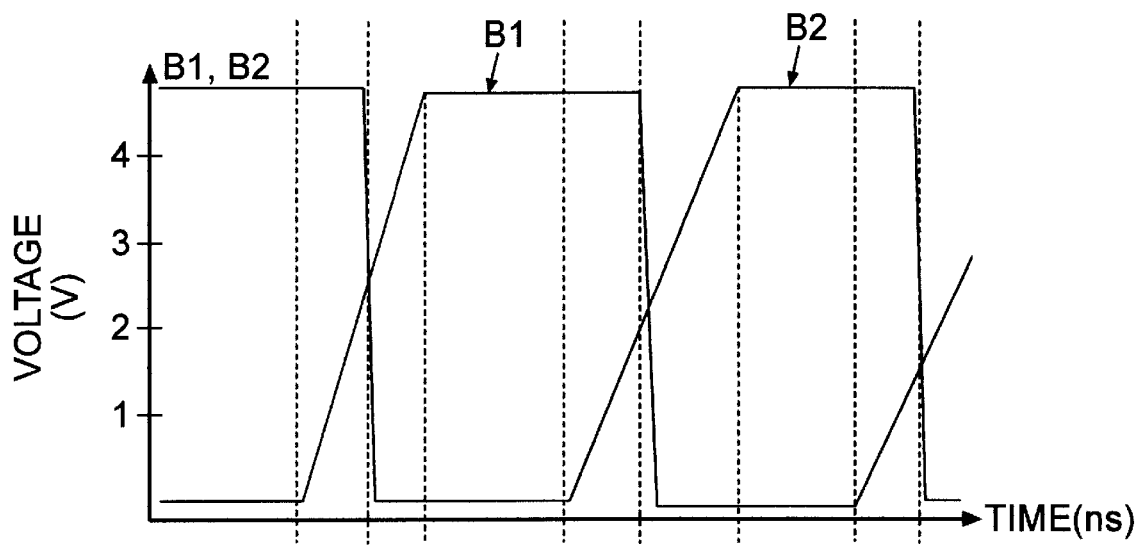
Figure 7D:
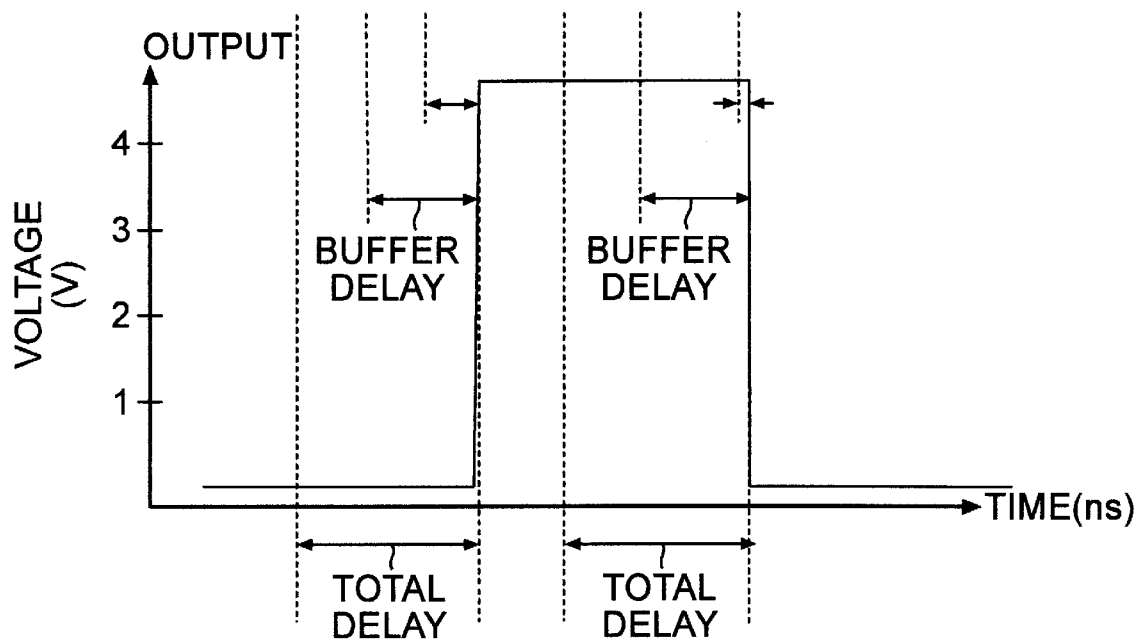

Note that the interface circuit of FIGS. 3 and 6 use only the fast high-to-low transitions of B1 and B2 to generate the output low-to-high and high-to-low transitions of the output and is indifferent to the slow high-to-low transitions of B1 and B2. Note for example, in FIG. 3, that the fast high-to-low transition of B2 generates a low-to-high output transition through the PF transistor while NF is off, and the fast high-to-low transition of B1 generates a high-to-low output transition through the NF transistor while PF is off. Also note that due to the output feedback connections to the two NOR gates, the NF (PF) transistor is on only during the B1 (B2) transition until the output transition is completed. For the remaining time, similar to the HD buffer, NF and PF are off. As for the HD buffer, a small latch on the output is required to maintain the output state.

All the gate elements of the input converter are minimally sized. N1 and N2 are equal in size. N1 and N2 represent a standard load equivalent to a tapering factor of e=2.7 for a minimum sized inverter ($W_{N1} \approx 11 \times W_{min}$). P1 and P2 are sized to pull B1 respectively B2 high in less than the output buffer delay, avoiding output glitches.

Consider A2 high. The buffer pulls the output high through PF (see FIG. 3). If P1 does not complete the process of pulling high B1 before the output signal transition is completed, the high output turns on NF through the feedback loop (both inputs of the NF NOR gate are low), creating a glitch on the output as well as a DC path between NF and PF. Typically P1 (P2) is smaller or the same size as N1 (N2), providing up to one-third the transconductance of N1 (N2). P1 (P2) must therefore be properly sized to complete the process of pulling high B1 (B2) in appropriate timing. Waveforms for the typical operation of a 3 V to 5 V interface are shown in FIG. 7.

The two NOR gates at the input of the buffer are sized to a load equivalent to a tapering factor of e=2.7 for N1 and N2. The remaining transistors are sized in a similar way as described in the above-referenced patent application for the HD buffer. For a low-to-high voltage interface, $V_{OH}$ of the low voltage circuit must be larger that $V_T$ of N1 and N2. For a high-to-low voltage interface (for example 5 V to 3 V), N1 and N2 must be high voltage (5 V) transistors with the same device parameters as the high voltage (5 V) circuitry in order to maintain device reliability.

Alternative sizing may exist, according to the speed-driving power trade-offs of the application. Also, the buffer stage may be implemented with any number of stages to reach the necessary driving strength of the application. Note that a significant driving strength is obtained even with a one-stage HD buffer due to the increasing size of N1–N2, NOR gates, and NF–PF.

In many other applications only the signal interfacing from one voltage signal to another is necessary, and buffering is not required. This may be the case, for example, when the interfaced signals are immediately loaded into registers for storage or further processing when other conditions into the processor are met. In this case, a minimal delay from input to output for the interfaced signal is desired. A voltage interface featuring a delay equivalent to an inverter is disclosed next and is appropriate for the above-described applications.

A transistor level schematic of the proposed interface circuit for a 3 V to 5 V interface is shown in FIG. 8. Note the 3 V–5 V demarcation line. At the left of the demarcation line is the input signal conditioning block, which here is a block operating at 3 volts. At the right of the demarcation line is the actual interface circuit.

A simplified version of the interface circuit of FIG. 8 is shown in FIG. 9. Note that NF and PF are the final transistors and are sized accordingly. NF and PF are driven so that at no time both of them are on, so that no DC path is created from VDD to ground. Also, since NF and PF never fight, optimal output transitions are obtained, better than for a similarly-sized inverter.

The circuit operation can be summarized as:
1. Consider In=low and PF off. The output is high.
2. A low-to-high input transition turns on NF and produces a fast high to-low output transition. A becomes low through I1 and B becomes high through G1. No DC path is produced for this transition, and the output response is instantaneous, and depends only on the NF sizing. PM1 is turned on and pulls C high. If PM1 did not exist, PF may be marginally on while In is high, producing a DC path from $V_{DD}$ to GND when NF is on and creating a parasitic power dissipation.
3. A high-to-low input transition turns off NF. The output remains low, while both NF and PF are off. While B remains high, A becomes high through I1, and the conditions for C to be pulled low are met. C turns on PF and the output is pulled high. G1 returns a low on B which turns off N2 and turns on P3, pulling C high. Accordingly, PF is turned off, preparing the interface for the next low-to-high input transition. Note that when C is pulled low (N1 and N2 are on), PM1 is on and there is a transitory DC path between $V_{DD}$ and GND through PM1–N2–N1, until B becomes low.
4. Note that after the low-to-high output transition is completed, PF is turned off after a delay equal to the G1 delay plus the P3 response. Accordingly, until the next low-to-high input transition, Out is floating. In a noisy environment, this may induce a loss of state of the output. To prevent this situation, PM transistor is inserted, which, driven by G1, maintains the high state. PM also produces a transitory DC path from $V_{DD}$ to GND through PM–NF when Input becomes high, for a duration equal to the delay of G1, until B becomes high and PM is turned off.
5. Note also that while the high-to-low output transition depends only on the NF response, the low-to-high output transition is determined by the I1 response, N1 and N2 response, and finally on PF response. While the rise and fall times of the output depend only on the transconductances of NF and PF, and are actually better than those of an inverter, since there is no short-circuit present between NF and PF. Since NF and PF are never both on, the input to output delays for the high-to-low output transitions are slightly non-equal.
6. Note that as PF pulls high, G1 turns on P3 which turns off PF. This feedback connection may create incomplete low-to-high output transitions of the output, PF being turned off sooner than necessary for a full low-to-high output transition. While from the sizing of G1 and PS can be adjusted, a preferred solution is shown in FIG. 8.

Note the operation of the circuit of FIG. 9 as compared with the circuit shown in FIG. 8:
1. NS is a minimally-sized transistor, and it pulls D low at the low-to-high input transition. When In is high, either Out, or D, or both are low, and accordingly, B is high.
2. A high-to-low input transition generates A high, and pulls C low. PF and P1 are turned on. While PF is sized for a fast output transition, P1 is minimum size. To turn N2 off and P3 on, both inputs of G1, out and D, must be high. While Out becomes high fast through PF, D becomes high slow through the minimum-sized P1. This assures a full swing of the output through PF. The fast transition of the output generated by PF and useful for the output signal, is hidden as P3 and N2 is concerned by the slow transition of D generated by the small-sized P1. Note that for the figure in FIG. 9, the N2 turn off and P3 turn on can be delayed by introducing an inverting delay (several invertors connected in series) instead of G1.

Several sizing considerations are applicable for the schematic shown in FIG. 8, and also for FIG. 9:
1. NF and PF are sized large since they provide the output waveform. If the driving strength of the circuit that drives the input permits, NF and PF can be sized quite large.
2. I1 is also sized large since its delay affects low-to-high output transition delay. For the same reason, N1 and N2 are large. N1 is larger than N2 since its gate swings to maximize the low voltage level.
3. P3 is sized minimum size since the slow PF turn off is beneficial. G1 is normally sized. Minimum size for G1 would be beneficial for the feedback loop as discussed, but a minimum sized G1 would increase the power dissipation through PM–NF. It is preferred to use a normal sized G1 and add an extra delay with an even number of invertors for the feedback loop operation.
4. NS is the minimum size since the high-to-low transition of D does not have any functional role in the operation of the schematic.
5. P1 is minimum sized to hide the PF fast response, as discussed above.
6. PM1 and PM are minimum size since their only role is to maintain the state on C respectively Out, and/or to compensate for the leakage and noise-induced problems.

Figure 1:
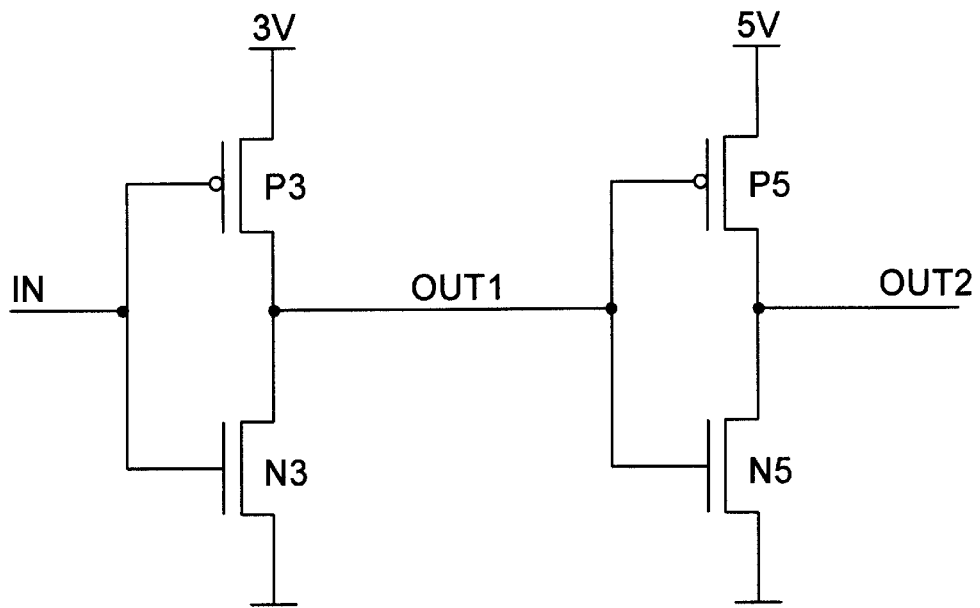
FIG. 1 is a schematic diagram of an interface between a low voltage and a high voltage CMOS family according to prior art.

As mentioned when discussing the operation of the circuit shown in FIG. 1, when Out1 is high, both N5 and P5 are on, and an important parasitic power dissipation is noted. To eliminate this parasitic power dissipation, two circuits are implemented into the next two disclosed voltage interfaces. For the circuit shown in FIG. 10, the P1 transistor (equivalent to P5 of FIG. 1) is turned off when In is high. For the circuit of FIG. 11, the P1 transistor (equivalent to P5 of FIG. 1) is biased near $V_{GS}=V_T$, or even into the subthreshold conduction region. The operation of these two interfaces is discussed in detail next.

For the interface shown in FIG. 10, consider:
1. The input transits from low-to-high.
2. NF is turned on, and a fast high-to-low output transition is produced. The larger the NF, the faster the transition.

A becomes high through I2, N1 is turned on, B becomes low through I1, and P3 is turned on. Accordingly, the P3–P2–P4–N1–NF path is biased. P2–P4 creates a voltage divider. For a 3-to-5 volts voltage interface, P2–P4 is sized so that the source of P1 is biased between 3 and 3.7 volts, if the $V_T$ of the PMOS transistor is 1 volt. This way, P1 is off, since its $V_{GS}$ when In is high (3 volts) is less than $V_T$. Note that while In is high, a DC path exists between $V_{DD}$ and GND through the P3–P2–P4–N1–NF path. However, the current through this path can be made minimal by sizing the transistors of this path, especially P2 and P4. The smaller the transistors are, the smaller is the current.

3. When In becomes low, NF is turned off, but P1 cannot pull high full swing due to the biasing circuitry present in its source. However, P1 can pull high to a level equal to the voltage level present at its source. A is still high. G1 is asymmetrically sized to switch at low thresholds, for example, at 1.5 volts for a 3-to-5 volts voltage interface. This way, when P1 pulls high at approximately 1.5 volts, C becomes low, and PF is turned on pulling out high fast. The larger the PF, the faster the output transition. A becomes low and PF is turned off so that when In becomes high again, NF and PF do not fight. Note that until In becomes high, out is tri-sate, being susceptible to noise and/or leakage. Several solutions exist depending on the application, such as placing a PMOS bleeder driver by I2 to maintain the output high, or even a small latch similar to the first two discussed interfaces. However, the bleeder is preferred, since when Out is low, the state is maintained by NF, so means to maintain this state are not necessary.

Note that the high-to-low output transition is immediate as the input transits, the high-to-low transition is initially slower, provided by P1, and then fast, provided by PF. The high-to-low output transition can be, however, optimized by a careful transistor sizing. General guidelines are:

1. Bias the source of P1 in the superior admissible range (3.7 volts for the discussed example) so that P1 can pull fast until the G1 threshold is reached, and P1 can pull high to a significant voltage level.
2. Size P1 large so that it can pull high fast.
3. Size G1 for a low-switching threshold for the low-to-high inputs transition.

The operation of the interface circuit shown in FIG. 11 is as follows:

1. When the input transits from low-to-high, NF is turned on, and the output transits from high-to-low. The larger the NF, the faster the output transition. P1 is biased to be minimally on, by inserting diode connected PMOS transistors in its source, sized to obtain a minimal $V_{GS}$, as close as possible to $V_T$ for P1. For example, for a 3-to-5 volts interface, and a $V_T$ of 1 volt, one transistor is sufficient (P2). P2 will operate into the subthreshold region, making the DC current from $V_{DD}$ to GND that is present while In is high through P2–P1–NF to be small.
2. When the input transits from high-to-low, NF turns off, and P1 pulls high to a level maximum equal to its source bias. B remains high. G1 detects the low-to-high transition with low thresholds, similarly to G1 discussed for the interface in FIG. 10. PF is turned on and pulls the output high. B becomes low and turns PF off. The same bleeder or latch, as discussed for the interface of FIG. 10, can be used for the same reasons.

Note that similar to the interface of FIG. 10, the high-to-low output transition is immediate as the input transits, the high-to-low transition is initially slower, provided by P1, and then fast, provided by PF. The high-to-low output transition can be, however, optimized by a careful transistor sizing. General guidelines are:

1. Size P1 large so that it can pull high fast.
2. Size G1 for a low-switching threshold for the low-to-high inputs transition.

Note the biasing at the source of P1(A) in the circuit of FIG. 11. Typically, A is biased at the high voltage level of the input plus $V_T$. However, a larger P2 size can slightly increase the voltage in A. A larger P2 is also recommended since when In becomes low and P1 pulls high, due to the increased transient current flowing through P2–P1, a small P2 would produce a large voltage drop that would adversely affect (slow down and decrease the swing) the output low-to-high transition to the G1 threshold.

In voltage interface circuits disclosed in FIGS. 10 and 11, once the two involved voltage levels (the input voltage level and the power supply level) are varied, the power dissipation may substantially increase. The voltage interface disclosed in FIGS. 12 and 13 make the circuit operation independent on the two voltage levels. The operation of the voltage interface circuit shown in FIG. 12 is as follows:

1. The voltage interface is non-inverting, therefore, the output logic level is equal to the input logic level.
2. When In is low, Out is low, H is low, A is low, P3 is off, P4 is on, F is high, N4 is off, N3 is off. Note that P4 is On and maintains C high, and therefore maintains Out low. P4 is a minimum size transistor (a bleeder). Also, N1 is off, N2 is off, and P1 and P2 are on.
3. Consider a low-to-high input transition. N2 is turned on, while P1 and P2 remains on. N1 is off. E will reach a maximum level of $V_E = V_{In} - V_{TN2}$. N2 must be sized large to pull E fast. N3 is turned on if $V_E > V_{TN3}$. Note that the high logic input level must be larger than $V_{TN2}$ (with body effect) plus $V_{TN3}$. This condition is considered met as noted in the following discussion. In this condition, N3 must be sized large to fight P4 and pull C fast to the low state. A becomes high and P1 and P4 are turned off. Note at this time that P1 is off, N1 is off, P2 and N2 are on. G and F remain charged approximately at $V_{DD}$. B is high.

After a delay introduced by I3 and I4, Out becomes high and N1 is turned on. N1, N2, and P2 are on, while P1 is off. Note that N1 and N2 pulls F low, while P2 discharges CG to a minimum value of $V_{In-high} + V_{TP2}$. At the same time, Out propagates to H through I5 and I6. B must remain high so that C remains low. Therefore, N1 and N2 must pull F low faster than Out propagates to H through I5 and I6. To this end, two extra inverters may be added to I5 and I6, increasing the delay. N1 must be sized large also, but smaller than N2 since the voltage swing on the gate of N1 is larger than the voltage swing on the gate of N2.

Once N1 is turned on, E is pulled low, N3 is turned off, and no transistor drives C since all N3, N4, P3, and P4 are off. To maintain C in the low state, N4 is driven by F (which is low) through I1. N4 is a bleeder, similarly to P4, therefore is minimum sized. In the final state, the following situation is noted: Out high, N1 on, E low, N3 off, N4 on, N2 on, F low, P3 off, C low, P4 off, P1 off, G at $V_{In-high} + V_{TP2}$.

4. Consider a high-to-low input transition. N2 is turned off, P2 remains on and pulls F high. F can be pulled high to the potential of G. Note that two conditions must be met in order not to alter the potential of G, and therefore allow F to be pulled at a large potential: 1) the input transition must be fast, and 2) CG must be larger than the capacitance at node F, so that the charge sharing between the two nodes is negligible. If these two conditions are met, F can be pulled high up to $V_{In\text{-}high}+V_{TP2}$. P2 is sized large to pull F fast, but is sized also as a trade-off to keep the potential at G as large as possible.

G1 must have a small low-to-high threshold switching voltage, to switch G1 output as soon as F is pulled high. For example, if F is pulled high at $V_{In\text{-}high}+V_{TP2}$, the threshold voltage of G1 must be $V_{In\text{-}high}$ or less. As G1 reaches the threshold, B becomes low and turns on P3, pulling C high. I1 has the same threshold as G1 in order to turn off N4 and therefore P3 does not fight for the state of C with N4, saving also power. P3 is sized large to pull C high fast. As C becomes high, A becomes low, P1 is turned on, G is pulled to $V_{DD}$, F is pulled to $V_{DD}$. Out becomes low after a delay introduced by I3 and I4 and turns N1 off. P3 remains on until Out propagates to H and B becomes high. The final state is reached, where: Out low, N1 off, E low, N3 off, N4 off, N2 off, F high, P3 off, C high, P4 on, P1 on, P2 on, G and F charged at $V_{DD}$.

5. Note that the input to output delay is, for the low-to-high transition, N2+N3+I2+I3+I4. For the high-to-low input transition, the delay is P2+G1+P3+I2+I3+I4. Note also that I2–I3–I4 can be sized as a tapered buffer.

As described, the transistor size for the voltage interface of FIG. 12 is chosen in order to maintain a large potential for G during the high-to-low input transition. To this end, as shown in FIG. 13, a transistor NB is connected as a keeper on node G. If the potential in G falls below a certain threshold voltage chosen by design, IB1 recognizes the threshold as a low logic level, switches high, and turns on the NB transistor through the IB2, IB3, and IB4 inverters. As soon as the voltage G is larger than the threshold voltage, IB1 recognizes the potential at G as a logic high and turns off NB through the chain of inverters. Note that the delay introduced by IB1, IB2, IB3, and IB4 is useful since NB still pulls high after the threshold is reached in G, realizing a stronger charge of CG. Note also that N1 is turned off through G2 and IN2 when NB in on so that no DC path is created from $V_{DD}$ to GND, minimizing the power dissipation. Note that due to this behavior, the thresholds of G1 and I1 are not required to be small as for the voltage interface disclosed in FIG. 12.

In the embodiment of FIGS. 3 to 6, the voltage interface transfers the digital signal between any two voltages, certain versions having no static power dissipation. Certain versions differ from the point of view of speed versus output driving strength trade-off. This interface contains circuitry operating at both involved voltages (power supplies). The voltage interface circuit of FIGS. 3 to 6 offers low power, high driving strength (buffering capabilities), similar delays from input to output for the low-to-high and high-to-low transitions, and minimal delays and power dissipation for the driving strength that is achieved. These features are obtained by employing a symmetric structure for the interface with two constituent branches, one for the low-to-high and one for the high-to-low transition.

In the embodiment of FIGS. 8 and 9, the voltage interface transfers the digital signal between any two voltages. The static power dissipation is minimal, and only during transitions. This interface contains circuitry operating at both involved voltages (power supplies). The FIGS. 8 and 9 voltage interface circuit offers low power and minimal delay from input to output without any buffering. However, the principal driving transistors in the circuit may be sized large, offering a certain driving strength. The circuit, from input to output, is equivalent to an inverter, and it has a delay similar to the delay of an inverter. The circuit can be actually used in the application as an inverter while providing voltage interface, this way hiding the delay introduced by the interface. These features are achieved using a structure with multiple feedback connections. The low-to-high and high-to-low input to output delays as well as the output transitions are slightly different.

Only one power supply is necessary in the embodiment of FIGS. 10 & 11 voltage interfaces. These voltage interfaces are designed to transfer a digital signal between two specific voltage levels without buffering. Changing the voltage levels which are selected may affect the power dissipation. The principal driving transistors in the circuit may be sized large, thereby offering a certain driving strength. The low-to-high and high-to-low input to output delays as well as the output transitions are slightly different.

Only one power supply is necessary for voltage interface circuits of FIGS. 12 & 13. The circuit operation eliminates the necessity of slight adjustments when the involved voltage levels change in order to offer low power as noted for the embodiments shown in FIGS. 10 and 11. Therefore, this embodiment can transfer the digital signal between a wide range of voltage levels. Minimal static power dissipation is possible. Certain output driving strength may be achieved. The low-to-high and high-to-low input to output delays as well as the output transitions are slightly different.

If buffering is not required, the circuit of FIGS. 8 & 9 provides a smaller delay from input to output as compared to the other embodiments, and also less power due to fewer transistors. However, if buffering is required, the circuit of FIGS. 3–6 provides a better speed and power as compared to the other embodiments where circuits are used to provide an equivalent driving strength.

The embodiment of FIGS. 10–13 are useful especially when the digital signal is transmitted between two different chips operating at different voltages, when on none of the chips both voltage levels (power supplies) are available, and when an extra pin for the additional voltage level (power supply) can not be placed on none of the chips due to constraints such as packaging. The embodiments of FIGS. 10 & 11 perform the function of an inverter, while the FIGS. 12 & 13 embodiments are non-inverting. The embodiments (FIGS. 12 & 13) also offer the advantage of allowing any two voltage levels to be interfaced with minimal power dissipation penalty as well as offers output buffering.

From the foregoing description, it will be apparent that there has been provided improved interface circuits especially suitable for interfacing digital CMOS circuits operating at different voltages. While several embodiments of these circuits have been described, other embodiments which are variations and modifications or otherwise follow the concepts and designs hereof will become apparent to those skilled in this technology. Accordingly, the foregoing description should be taken as illustrative and not in a limiting sense.

What is claimed is:

1. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, the signal conditioning block has means which cause said first and second outputs to switch states when the input signal is switching state and which provide said first and second output signals in high state and low state when overlapping, and one of said first and second output signals high and the other of said first and second output signals low, when said first and second output signals are not overlapping, where the interface block has two inputs and two outputs between which are connected two NMOS and two PMOS transistors, where the NMOS transistors are driven by the inputs and the PMOS transistors are driven by the outputs.

2. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, the signal conditioning block has means which provide said first and second signals in non-overlapping relationship during their high state, in overlapping relationship during their low state and when one of said first and second output signals is low the other thereof is high, and where said signal conditioning circuit has means whereby said first and second outputs switch state when said input signal switch state, where the interface block has two inputs and two outputs between which are connected two NMOS and two PMOS transistors, where the NMOS transistors are driven by the inputs and the PMOS transistors are driven by the outputs.

3. The circuit of claim 1 further comprising an output buffer block to which said outputs of said interface block are connected, and means responsive to high to low transitions of each of the outputs of said interface block which are contained in said buffer block to generate high to low and low to high output transitions of the interface circuit while eliminating the low to high transitions of each of the outputs of said interface block for the generation of output transitions from the interface circuit.

4. The circuit of claim 2 further comprising an output buffer block to which said outputs of said interface block are connected; and means, responsive to high to low transitions of each of the outputs of said interface block which are contained in said buffer block, to generate high to low and low to high output transitions of the interface circuit while eliminating the low to high transitions of each of the outputs of said interface block for the generation of output transitions from the interface circuit.

5. The circuit of claim 3 where said buffer block has a symmetric structure with two branches.

6. The circuit of claim 4 where said buffer block has a symmetric structure with two branches.

7. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, the signal conditioning block has means which cause said first and second outputs to switch states when the input signal is switching state and which provide said first and second output signals in high state and low state when overlapping, and one of said first and second output signals high and the other of said first and second output signals low, when said first and second output signals are not overlapping, wherein the interface block has an NMOS transistor and means including said NMOS transistor for producing the high to low output transition from the interface circuit which NMOS transistor is directly driven from the input of the interface circuit, the interface block including a PMOS transistor and means for producing the low to high output transition from the interface via a feedback loop controlled by both input and output signals of the interface.

8. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, the signal conditioning block has means which provide said first and second signals in non-overlapping relationship during their high state, in overlapping relationship during their low state and when one of said first and second output signals is low the other thereof is high, and where said signal conditioning circuit has means whereby said first and second outputs switch state when said input signal switch state, wherein the interface block has an NMOS transistor and means including said NMOS transistor for producing the high to low output transition from the interface circuit which NMOS transistor is directly driven from the input of the interface circuit, the interface block including a PMOS transistor and means for producing the low to high output transition from the interface via a feedback loop controlled by both input and output signals of the interface.

9. The circuit of claim 7 where the loop driving the PMOS transistor for producing the low to high output transition of the interface circuit is connected in driving relationship with the negated input and the negated output of the interface circuit.

10. The circuit of claim 8 where the loop driving the PMOS transistor for producing the low to high output transition of the interface circuit is connected in driving relationship with the negated input and the negated output of the interface circuit.

11. The circuit of claim 7 where the interface block includes a PMOS transistor having a source which is connected to the higher voltage output of a power supply and a NMOS transistor having a source connected to the lower voltage terminal of the power supply, said NMOS and PMOS transistors have drains which are connected together to provide a terminal for an intermediate output signal of the interface block, the gate of the NMOS transistor is connected to the input node of the interface, the gate of the PMOS transistor is responsive to the same signal that drives the PMOS transistor that produces the low to high output transition of the interface, and the loop driving the PMOS transistor that produces the low to high output transition of the interface is driven by the negated input signal to the interface input node via a combinatorial circuit having as inputs, the output of the interface circuit and the said intermediate output signal from the drains of the NMOS and PMOS transistors.

12. The circuit of claim 8 where the interface block includes a PMOS transistor having a source which is connected to the higher voltage output of a power supply and a NMOS transistor having a source connected to the lower voltage terminal of the power supply, said NMOS and PMOS transistors have drains which are connected together to provide a terminal for an intermediate output signal of the interface block, the gate of the NMOS transistor is connected to the input node of the interface, the gate of the PMOS transistor is responsive to the same signal that drives the PMOS transistor that produces the low to high output transition of the interface, and the loop driving the PMOS transistor that produces the low to high output transition of the interface is driven by the negated input signal to the interface input node via a combinatorial circuit having as inputs, the output of the interface circuit and the said intermediate output signal from the drains of the NMOS and PMOS transistors.

13. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, where said first output signal is provided at drains of an NMOS and a PMOS transistor that have gates connected to said input node and said second output signal is provided at the source of said NMOS transistor and the drain of another NMOS transistor.

14. The Circuit of claim 13 where an output buffer block is connected to said interface block and is responsive to said different output signal for providing an output signal of said output node.

15. The circuit of claim 14 where said output buffer is a tapered buffer.

16. The circuit of claim 15 where the source of said PMOS transistor is connected to the drains of two other PMOS transistor.

17. A CMOS voltage interface circuit having an input node which provides an input signal to said interface circuit and also an output node, said interface circuit comprising an input signal conditioning block connected to said input node and providing first and second output signals corresponding to said input signal, and an interface block responsive to said first and second output signals which provides at least a different output signal having a selected output level, where said first output signal is provided at drains of an NMOS and a first PMOS transistor that have gates connected to said input node, and said second output signal is provided at the source of said first PMOS transistor and the drain and gate of a second PMOS transistor.

18. The circuit of claim 17 where the source of said first PMOS transistor is biased with respect to a voltage $V_{DD}$;
the NMOS transistor provides the fast high-to-low output transition;
the low-to-high output transition provided by the first PMOS transistor is enhanced by another PMOS transistor.

19. The circuit of claim 18 wherein the source of the said first PMOS transistor is biased using a voltage divider or a voltage source.

20. The circuit of claim 18 wherein the source of said PMOS transistor is biased by a diode connected to at least one PMOS transistor.

21. A CMOS voltage interface circuit having an input node which provides an input signal to said CMOS voltage interface circuit, and an output node which provides an output signal from said CMOS voltage interface circuit, said interface circuit comprising:

(a) circuits operating respectively from two power supplies, providing voltages, $V_{DD-low}$ and $V_{DD-high}$ with $V_{DD-high} > V_{DD-low}$, the circuit operating at said $V_{DD-low}$ being connected between a voltage supply rail $V_{DD-low}$ and another voltage supply rail ground, and accepting and generating only logic signals corresponding to nominal values of logic-low=0 volts (or ground potential) and logic-high=$V_{DD-low}$ volts, while the circuit operating at said $V_{DD-high}$ being connected between a voltage supply rail $V_{DD-high}$ and another voltage supply rail ground, and accepting logic signals corresponding to nominal values of logic-low=0 volts (or ground potential) and logic-high=$V_{DD-low}$ volts as well as logic-high=$V_{DD-high}$ volts, and generating only logic signals corresponding to nominal values of logic-low=0 volts (or ground potential) and logic high= $V_{DD-high}$ volts;

(b) said circuits being in a signal conditioning block operating at said $V_{DD-low}$, and an interface block and a buffer block, both operating at said $V_{DD-high}$;

(c) said signal conditioning block receiving as input said input signal and generating first and second output signals that switch states only when said input signal switches states, and where the said first and second output signals can be in non-overlapping relationship while in high logic state;

(d) said interface block having two NMOS (first and second) and two PMOS (first and second) transistors, said first and second output signals drive respectively said first and second NMOS transistors, the drains of said first and second NMOS transistors represent the output nodes of the said interface block (respectively third and fourth output nodes providing third and fourth outputs), and said third and fourth output nodes drive respectively said first and second PMOS transistors, the drain of the said first PMOS transistor is connected to the drain of the said second NMOS transistor, and the drain of the said second PMOS transistor is connected to the drain of the said first NMOS transistor, and the sources of the said first and second NMOS transistors are connected to said ground rail and the sources of said first and second PMOS transistors are connected to said $V_{DD-high}$ rail; and (e) said buffer block has two inputs represented by the said third and fourth outputs, and generates said output signal.

22. The circuit of claim 21 wherein the said buffer block has means responsive to high-to-low transitions of each of the said third and fourth outputs to generate the respectively high-to-low, low-to-high transitions of said output node while eliminating the low-to-high transitions of each of the said third and fourth outputs in generating the transitions of said output node.

23. A CMOS voltage interface circuit having an input node which provides an input signal to said CMOS voltage interface circuit, and an output node which provides an output signal from said CMOS voltage interface circuit, said interface circuit comprising:

(a) circuits operating respectively from two power supplies, $V_{DD-low}$ and $V_{DD-high}$ with $V_{DD-high>VDD-low}$, the circuit operating at said $V_{DD-low}$ being connected between a voltage supply rail $V_{DD-low}$ and another voltage supply rail=0 volts (or ground potential), and accepting and generating only logic signals corresponding to nominal values of logic-low=0 volts (or ground potential) and logic-high=$V_{DD-low}$ volts, while the circuits operating at said $V_{DD-high}$ being connected between a voltage supply rail $V_{DD-high}$ and another voltage supply rail ground, and accepting logic signals corresponding to nominal values of logic-low=0 volts (or ground potential) and logic-high=$V_{DD-low}$ volts as well as logic-high=$V_{DD-high}$ volts, and generating only logic signals corresponding to nominal values of logic-low=0 volts (or ground potential) and logic high=$V_{DD-high}$ volts;

(b) circuits providing a signal conditioning block operating at said $V_{DD-low}$, and an interface block operating at said $V_{DD-high}$;

(c) said interface block has an NMOS transistor which is directly driven by said input signal;

(d) said interface block has means including said NMOS transistor for producing the high-to-low transition of said output node; and (e) said interface block has means, including a PMOS transistor, for producing the low-to-high transition of said output node via a feedback loop controlled by both said input signal and said output signal.

24. The circuit of claim 23 wherein means are provided for said PMOS transistor to be connected in driving relationship with the negated of said input signal as generated by said signal conditioning block, and the negated of said output signal.

25. The circuit of claim 23 wherein said interface block has means including a second PMOS transistor having the source connected to said $V_{DD-high}$ rail and a second NMOS transistor having the source connected to said ground rail, said second NMOS and second PMOS transistors having the drains connected together to provide an intermediate output signal, where the gate of said second NMOS transistor is connected directly to the said input node, the gate of said second PMOS transistor is responsive to the same signal that drives the said PMOS transistor that produces the low-to-high transition of said output node, and where said PMOS transistor is driven by the negated of said input signal as generated by the said signal conditioning block via a combinatorial circuit having as additional inputs the said output signal and the said intermediate output signal.

26. A CMOS voltage interface circuit having an input node which provides an input signal to said CMOS voltage interface circuit, and an output node which provides an output signal to said CMOS voltage interface circuit, said interface circuit comprising:

(a) a plurality of circuit blocks which operate at only one power supply, $V_{DD-high}$, and are being connected between a voltage supply rail $V_{DD-high}$ and another voltage supply rail ground;

(b) the said input signal is a logic signal of nominal values of logic-low=0 volts (or ground potential) and logic-high=$V_{DD-low}$ volts with $V_{DD-high} > V_{DD-low}$;

(c) means which accepts as an input to said interface circuit, said input signal and generates only logic signals corresponding to nominal values of said logic-low and said logic-high;

(d) said input signal drives an NMOS and a PMOS transistor, where the drains of said NMOS and PMOS transistors are connected together and connected to said output node, the source of said NMOS transistor is connected to said ground rail and the source of said PMOS transistor is connected to an internal node;

(e) said NMOS transistor provides the fast high-to-low transition of said output node; and (f) means are provided to bias said internal node only when the said input node is in high logic state, whereby minimizing the current flowing through the said PMOS transistor.

27. The circuit of claim 26 wherein:

(a) means are provided so that said internal node to be biased by a voltage divider that is active and provides said required voltage only when said input node is in logic high state, and when the said bias for said internal node is such that said PMOS transistor is off when said voltage divider is active; and (b) means are provided for a second PMOS transistor to be driven by a combinatorial circuit having as inputs said output node and a set of conditioning signals driving said voltage divider, where said second PMOS transistor provides the fast low-to-high transition of said output node.

28. The circuit of claim 26 wherein:

(a) means are provided so that said internal node to be biased by one or more diode connected MOS transistors placed between the said $V_{DD-high}$ rail and said internal node, so that when the said input node is in high logic state, the said required voltage provides a minimal turn-on state for said PMOS transistor;

(b) a diode connected MOS transistor is a transistor that has the source representing one terminal of an equivalent diode, and the drain and the gate are connected together and represent the second terminal of the equivalent diode; and (c) means are provided for a second PMOS transistor to be driven by a combinatorial circuit having as main input the said output node and the delayed, negated said output node, where said second PMOS transistor provides the fast low-to-high transition of said output node.

29. A CMOS voltage interface circuit having an input node which provides an input signal to said CMOS voltage interface circuit, and an output node which provides an output signal to said CMOS voltage interface circuit, said interface circuit comprising:

(a) a plurality of circuit blocks operating at only one power supply, $V_{DD-high}$, and are being connected between a voltage supply rail $V_{DD-high}$ and another voltage supply rail ground;

(b) the said input signal is a logic signal of nominal values of logic-low=0 volts (or ground material) and logic-high=$V_{DD-low}$ volts, with $V_{DD-high} > V_{DD-low}$;

(c) means which accepts as an input to said interface circuit said input signal and generates only logic signals corresponding to nominal values of said logic-low and said logic-high;

(d) said input signal drives an NMOS and a PMOS transistor, where the drains of said NMOS and PMOS transistors are connected together forming an intermediate output node, where the source of said NMOS transistor is connected to a first internal node, and where the source of said PMOS transistor is connected to a second internal node;

(e) means connected to said intermediate output node for providing an (odd+n) stage buffered output, with n greater or equal to zero and where odd is any odd number;

(f) said first internal node is pulled towards the said logic-low potential by a second NMOS transistor driven by the (odd+n) stage buffered output where n=2, said second NMOS transistor having the source connected to the said ground rail;

(g) said second internal node is pulled towards the said $V_{DD-high}$ volts by a second PMOS transistor driven by the odd stage buffered output, said second PMOS transistor having the source connected to said $V_{DD-high}$ rail;

(h) a third NMOS transistor providing the high-to-low transition of said output node is driven by the said first internal node;

(i) a third PMOS transistor providing the low-to-high transition of said output node is driven by a combinatorial circuit having as inputs the said (odd+2) stage buffered output and said intermediate output node;

(j) a fourth NMOS transistor driven by the negated said intermediate output node is provided as a bleeder for said output node; and (k) a fourth PMOS transistor driven by the said odd stage buffered output is provided as a bleeder for said output node.

30. The circuit of claim 29 wherein:

(a) the said second internal node is driven by a fifth PMOS transistor which is driven by a chain of even number of inverters (where even is greater or equal to four), said chain having as input the said second internal node; and (b) said second NMOS transistor is driven now by a combinatorial circuit (in particular an AND gate) having as inputs said (odd+2) stage buffered output and an internal signal representing the output of an even number of inverters of said chain, where said even number is smaller than four.

* * * * *